United States Patent
Faulkner et al.

(10) Patent No.: US 8,280,654 B2
(45) Date of Patent: Oct. 2, 2012

(54) CONDUCTOR APPARATUS, SYSTEM, AND METHOD OF DISPLAYING WHETHER A NUMBER OF CONDUCTORS CONDUCT CURRENT

(75) Inventors: Mark A. Faulkner, Greenwood, SC (US); Rodney L. Spottsville, Simpsonville, SC (US)

(73) Assignee: Eaton Corporation, Cleveland, OH (US)

( * ) Notice: Subject to any disclaimer, the term of this patent is extended or adjusted under 35 U.S.C. 154(b) by 452 days.

(21) Appl. No.: 12/511,298

(22) Filed: Jul. 29, 2009

(65) Prior Publication Data

US 2011/0029263 A1    Feb. 3, 2011

(51) Int. Cl.
*G01R 31/00*   (2006.01)
*G01S 19/03*   (2010.01)

(52) U.S. Cl. ........................................ 702/59; 342/357.4

(58) Field of Classification Search .................... 702/59, 702/57–58, 60–62, 64–65, 81, 84, 127, 150, 702/182–185, 188; 324/66, 76.11, 149, 500, 324/512, 520–522, 537, 539, 543, 764.01; 340/3.1, 3.43, 500, 531, 540, 545.2, 635, 340/686.1, 687, 870.16, 870.39; 342/357.2, 342/357.4, 357.58, 357.62, 357.64–357.65, 342/357.74

See application file for complete search history.

(56) References Cited

U.S. PATENT DOCUMENTS

| | | | |
|---|---|---|---|
| 5,565,783 A | 10/1996 | Lau et al. | |
| 6,313,752 B1 * | 11/2001 | Corrigan et al. | 340/657 |
| 7,145,322 B2 | 12/2006 | Solveson et al. | |
| 7,253,602 B2 | 8/2007 | Shvach et al. | |
| 2004/0183522 A1 * | 9/2004 | Gunn et al. | 324/126 |
| 2004/0198382 A1 | 10/2004 | Wong | |
| 2006/0165023 A1 | 7/2006 | Faulkner et al. | |
| 2007/0249319 A1 | 10/2007 | Faulkner et al. | |
| 2008/0125984 A1 * | 5/2008 | Skendzic et al. | 702/59 |
| 2008/0129622 A1 | 6/2008 | Freeland et al. | |
| 2009/0063680 A1 | 3/2009 | Bridges et al. | |

OTHER PUBLICATIONS

Wikimedia Foundation, Inc., "Solar energy", Wikipedia, http://en.wikipedia.org/wiki/Solar_energy, Mar. 31, 2009, 22 pp.
Appleman, D., "Gadgets Examiner: Put a GPS tracking device in your kid's watch", http://www.examiner.com/x-1652-Gadgets-Examiner-y2009m1d7-Put-a-GPS-tracking-de..., Jan. 7, 2009, 3 pp.

* cited by examiner

*Primary Examiner* — Toan M Le
(74) *Attorney, Agent, or Firm* — Dawn C. Wolff; Martin J. Moran

(57) ABSTRACT

An apparatus is for a conductor capable of conducting a current. The apparatus includes a global positioning system device structured to determine location of the global positioning system device, a coupling device structured to couple the global positioning system device to the conductor, and a power supply structured to power the global positioning system device responsive to a current conducted by the conductor. The global positioning system device is further structured to wirelessly communicate the determined location when powered by the power supply responsive to the current conducted by the conductor. The global positioning system device does not wirelessly communicate when current is not conducted by the conductor.

16 Claims, 2 Drawing Sheets

CONDUCTOR APPARATUS, SYSTEM, AND METHOD OF DISPLAYING WHETHER A NUMBER OF CONDUCTORS CONDUCT CURRENT

BACKGROUND

1. Field

The disclosed concept pertains generally to conductors and, more particularly, to conductors, such as, for example, power conductors of a power distribution system. The disclosed concept also pertains to systems and methods for indicating status of such conductors.

2. Background Information

A major problem for an electric utility or other power distribution system is knowing the location of a faulted power cable or knowing when a power cable ceases to conduct current. For example, known methods of determining this information include analyzing reports (e.g., telephone calls) from electric utility customers and/or reports from electric utility maintenance personnel.

A global positioning system (GPS) receiver calculates its position by precisely timing signals sent by GPS satellites. Each GPS satellite continually transmits messages containing the time the message was sent, precise orbital information, and the general system health and rough orbits of all GPS satellites. The GPS receiver measures the transit time of each message and computes the distance to each GPS satellite. Geometric analysis combines these distances with the location of the GPS satellites to determine the GPS receiver's location. The position can be displayed, perhaps with a moving map display, latitude and longitude, and/or elevation information. Some GPS units also show derived information, such as direction and speed, calculated from position changes.

In general, a GPS receiver includes an antenna, tuned to the frequencies transmitted by the GPS satellites, receiver-processors, and a highly-stable clock. The GPS receiver can also include a display for providing location and speed information to the user. Many GPS receivers can relay position data to a PC or other device using a suitable protocol. Some GPS receivers can interface with other devices using methods including a serial connection, USB or Bluetooth.

GPS receivers are known to be powered from a battery or from a conventional three-prong input, AC/DC power supply.

U.S. Patent Application Publication No. 2004/0198382 discloses a locator device carried on or by a person, particularly a child, that sends out a signal using satellite technology known as GPS. After the child is wearing the GPS locator device, a parent, guardian or care giver logs onto a computer, or a cellular phone or other communication equipment with a GPS feature, and a web page map reveals the child's location to within a few feet.

U.S. Patent Application Publication No. 2009/0063680 discloses a system for using signals from a GPS system to determine a physical location of a mobile electric resource, such as a plug-in electric vehicle, on a power grid. Using GPS enables a remote intelligent power flow (IPF) module to resolve its physical location on a power network in a non-exact manner. Noisy location information from GPS is transmitted to a flow control server, which uses it with a survey information database to infer the location of the mobile electric resource.

U.S. Pat. No. 5,565,783 discloses a fault sensor device, which can detect and distinguish abnormal current and voltage events on an alternating current overhead and underground transmission line or distribution line. The fault sensor device is contained in an elongated molded plastic housing. The fault sensor device includes a current sensor and a voltage sensor connected in proximity to the transmission or distribution line for monitoring current and voltage analog signals. An analog-to-digital converter connected to the current and voltage sensors samples the current and voltage analog signals and produces corresponding digital signals. A processor responds to the digital signals and detects an abnormal condition and distinguishes whether any of a plurality of types of faults have occurred. A transmitter transmits the fault information from the processor to a remote location. Power to operate the overhead sensing device electronics and transceiver is derived from a bank of double-layer capacitors charged by two panels of photovoltaic cells mounted on the housing surface of the overhead fault sensing device. Power to operate the underground fault sensor is derived from the bank of double-layer capacitors charged by inductive power from current through the underground power line. The fault sensor is mounted on an energized overhead power line easily and quickly by a so-called "hot stick" manipulated by an individual on the ground, in a bucket truck, or from a power line pole.

A geographic information system (e.g., a geographical information system) (GIS) can capture, store, analyze, manage and present data that is linked to location. A GIS can be a computer system capable of capturing, storing, analyzing and displaying geographically referenced information or data identified according to location.

Google® created a Google® Maps API (application programming interface) to allow developers to integrate Google® Maps into their web sites with their own data points. By using the Google® Maps API, it is possible to embed the full Google® Maps site into an external web site. The Google® Maps API provides a number of utilities for manipulating maps, as with Google® Maps, and adds content to the map through a variety of services, allowing the creation of robust map applications on the web site. Developers request an API key, which is bound to the web site and directory entered when creating the key. A customized map interface is created by adding Google® JavaScript code to a page, and then using Javascript functions to add points to the map. Rather than specifying and setting up individual controls, a developer can specify that the map exhibit the look and feel of the Google® UI (user interface). The developer uses a GMap2.setUIToDefault( ) method, which adds a set of controls and user input behavior to the map corresponding to what is available in the UI on Google® Maps. This behavior is also dynamic, such that if the Google® UI changes, the web site automatically gets any new UI behavior after the API updates to reflect those changes, although there can be a delay between when a feature shows up on Google® Maps and when it is added to the Google® Maps API.

There is room for improvement in apparatus, systems and methods for indicating status of conductors, such as, for example, the power conductors of a power distribution system.

SUMMARY

These needs and others are met by embodiments of the disclosed concept, which provide a global positioning system device structured to wirelessly communicate a determined location of the device when powered by a power supply responsive to current conducted by a conductor, and structured to not wirelessly communicate when current is not conducted by the conductor.

In accordance with one aspect of the disclosed concept, an apparatus for a conductor capable of conducting a current comprises: a global positioning system device structured to determine location of the global positioning system device; a coupling device structured to couple the global positioning system device to the conductor; and a power supply structured to power the global positioning system device responsive to a current conducted by the conductor, wherein the global positioning system device is further structured to wirelessly communicate the determined location when powered by the power supply responsive to the current conducted by the conductor, and wherein the global positioning system device does not wirelessly communicate when current is not conducted by the conductor.

The power supply may be a parasitic power supply structured to power the global positioning system device responsive to the current conducted by the conductor and to remove power from the global positioning system device when current is not conducted by the conductor.

The power supply may comprise a solar power supply structured to output power responsive to solar energy, a detector structured to detect the current conducted by the conductor, and a switch structured to power the global positioning system device from the output power when the detector detects the current conducted by the conductor and to remove power from the global positioning system device when the detector does not detect current conducted by the conductor.

As another aspect of the disclosed concept, a system comprises: a conductor capable of conducting a current; an apparatus comprising: a global positioning system device structured to determine location of the global positioning system device, a coupling device coupling the global positioning system device to the conductor, and a power supply structured to power the global positioning system device responsive to a current conducted by the conductor; and a display remote from the apparatus, wherein the global positioning system device is further structured to wirelessly communicate the determined location to the display when powered by the power supply, and wherein the global positioning system device does not wirelessly communicate when current is not conducted by the conductor.

As another aspect of the disclosed concept, a method of displaying whether a number of conductors conduct current comprises: coupling a global positioning system device to a number of the number of conductors, the global positioning system device being structured to determine location of the global positioning system device; powering the global positioning system device responsive to a current conducted by the number of the number of conductors; employing a display remote from the global positioning system device; wirelessly communicating the determined location to the display when the global positioning system device is powered responsive to the current conducted by the number of the number of conductors; and not wirelessly communicating when current is not conducted by the number of the number of conductors.

The method may further comprise: employing as the number of conductors a plurality of conductors, each of the plurality of conductors being capable of conducting a corresponding current; and for each of the plurality of conductors other than the number of the number of conductors: coupling a corresponding global positioning system device to a corresponding one of the plurality of conductors other than the number of the number of conductors, the corresponding global positioning system device being structured to determine a corresponding location of the corresponding global positioning system device, powering the corresponding global positioning system device responsive to a corresponding current conducted by the corresponding one of the plurality of conductors other than the number of the number of conductors, wirelessly communicating the determined corresponding location to the display when the corresponding global positioning system device is powered responsive to the corresponding current conducted by the corresponding one of the plurality of conductors other than the number of the number of conductors, and not wirelessly communicating when the corresponding current is not conducted by the corresponding one of the plurality of conductors other than the number of the number of conductors.

The method may further comprise: for the number of the number of conductors, displaying the determined location at the display when the global positioning system device is powered responsive to the current conducted by the number of the number of conductors; and for each of the plurality of conductors other than the number of the number of conductors, displaying the corresponding determined location at the display when the corresponding global positioning system device is powered responsive to the corresponding current conducted by the corresponding one of the plurality of conductors other than the number of the number of conductors.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

As employed herein, the term "number" shall mean one or an integer greater than one (i.e., a plurality).

As employed herein, the term "processor" means a programmable analog and/or digital device that can store, retrieve, and process data; a computer; a workstation; a personal computer; a microprocessor; a microcontroller; a microcomputer; a central processing unit; a mainframe computer; a mini-computer; a server; a networked processor; or any suitable processing device or apparatus.

As employed herein, the statement that two or more parts are "coupled" together means that the parts are joined together either directly or joined through one or more intermediate parts.

As employed herein the term "power bus" means a power conductor; a power bus bar; and/or a power bus structure.

As employed herein, the term "wireless" means without a wire, without an electrical conductor, and without an optical fiber or waveguide.

As employed herein, the term "conductor" means the same as the term "electrical conductor", which is capable of conducting an electrical current.

As employed herein, the term "wireless signal" means a radio frequency signal, an infrared signal or another suitable visible or invisible light signal that is transmitted and/or received without a wire, without an electrical conductor, and without an optical fiber or waveguide.

The disclosed concept is described in association with a power conductor, although the disclosed concept is applicable to a wide range of conductors that conduct direct current (DC) or alternating current (AC).

Figure 1:
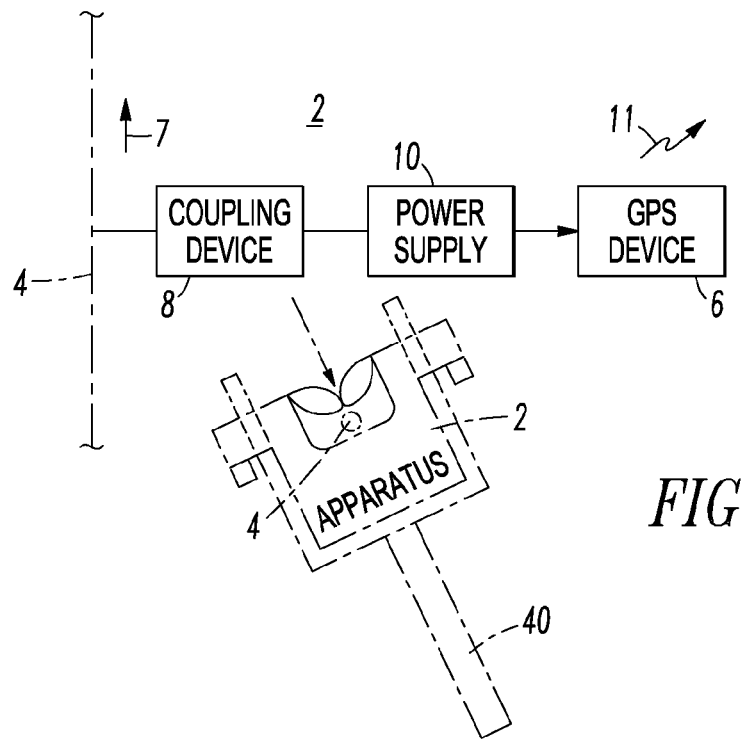
FIG. 1 is a block diagram in schematic form of an apparatus for a conductor capable of conducting a current in accordance with embodiments of the disclosed concept.

Referring to FIG. 1, an apparatus 2 for a conductor, such as the example power conductor 4 (shown in phantom line drawing), which is capable of conducting an electrical current, is shown. The apparatus 2 includes a global positioning system (GPS) device, such as the example GPS module 6, structured to determine location of the GPS module 6. A coupling device 8 is structured to couple the GPS module 6 (and/or the apparatus 2) to the power conductor 4. A power supply, such as the example power conditioning section 10, is structured to power the GPS module 6 responsive to a current 7 conducted by the power conductor 4. The GPS module 6 is further structured to wirelessly communicate the determined location using a wireless signal 11 when powered by the example power conditioning section 10 responsive to the current 7 conducted by the power conductor 4. The GPS module 6 does not wirelessly communicate when current is not conducted by the power conductor 4 for example reasons as will be explained, below.

The wireless signal 11 from the GPS module 6 (FIGS. 1 and 2) can be, for example and without limitation, an alarm e-mail message, an alarm text message, or a message communicated over a communication network, such as the Internet.

The GPS module 6 (FIGS. 1 and 2) can preferably include a first indicator (not shown), such as an LED, to indicate when the GPS system (not shown) is active, and/or a second indicator (not shown), such as a two-color target area (not shown), to indicate with a first color (e.g., without limitation, red) that the wireless signal 11 is inactive and to indicate with a different second color (e.g., without limitation, green) that the wireless signal 11 is active.

Example 1

The disclosed apparatus 2 can be applied to, for example and without limitation, a wide range of conductors, such as the example power conductor 4, other utility and power distribution cables, and a wide range of cables or other conductors that conduct electrical current. A few non-limiting examples of such conductors include a distribution alternating current (AC) power line, a utility power cable, a power distribution cable, and a power bus.

Example 2

The current 7 conducted by the example power conductor 4 can be a direct current (DC) or an alternating current (AC).

Example 3

The example power conditioning section 10 can be a parasitic power supply structured to power the example GPS module 6 responsive to the current 7 conducted by the example power conductor 4, and to remove power from the example GPS module 6 when current is not conducted by the example power conductor 4. Non-limiting examples of parasitic power supplies are disclosed in U.S. Pat. Nos. 7,145,322; and 7,253,602, which are incorporated by reference herein. Preferably, the example power conditioning section 10 is suitably clamped to and/or insulatively coupled to the example power conductor 4 by the coupling device 8.

Example 4

Figure 2:
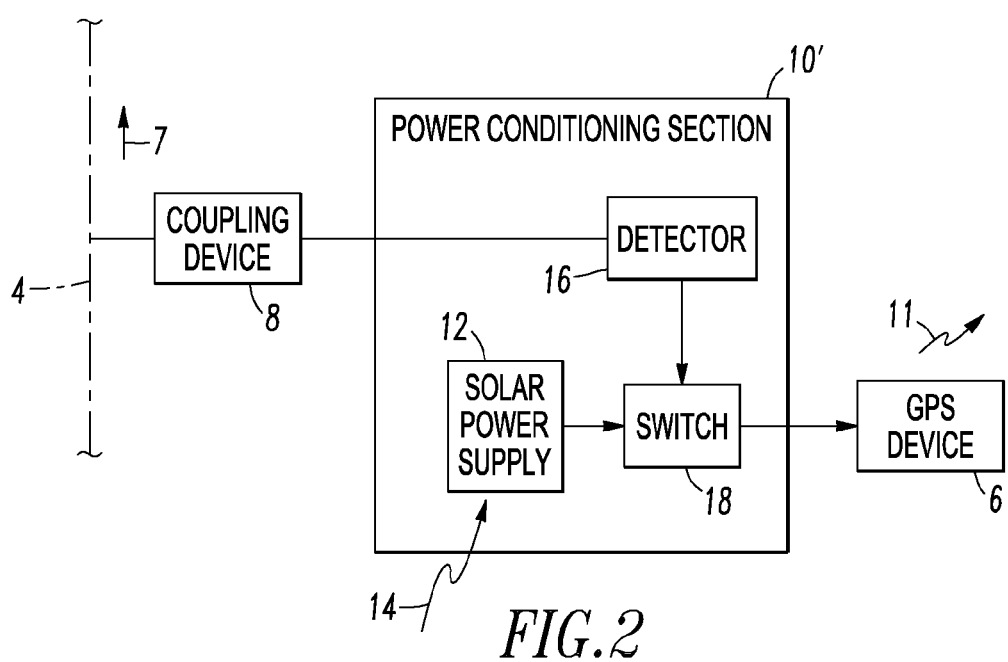
FIG. 2 is a block diagram in schematic form of a solar power supply for the apparatus of FIG. 1.

As an alternative to and/or as a supplement to a parasitic power supply (e.g., Example 3, above), an example power conditioning section 10', as shown in FIG. 2, can include a solar power supply 12 (e.g., using solar (photovoltaic) power) structured to output power responsive to solar energy 14, a detector 16 structured to detect the current 7 conducted by the example power conductor 4, and a switch 18 structured to power the example GPS module 6 from the output power of the solar power supply 12 when the detector 16 detects the current 7 conducted by the example power conductor 4 and to remove power from the GPS module 6 when the detector 16 does not detect current conducted by the example power conductor 4. Alternatively, the solar power supply 12 can be a parasitic power supply or any suitable supplemental power supply (e.g., without limitation, back-up; battery).

Example 5

Figure 3:
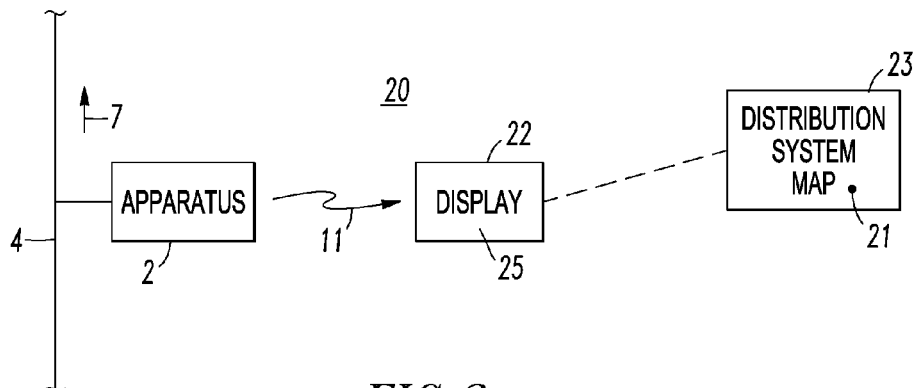
FIG. 3 is a block diagram in schematic form of a system using the apparatus of FIG. 1.

Referring to FIG. 3, a system 20 includes the apparatus 2 and the example power conductor 4 of FIG. 1, and a display 22 remote from the apparatus 2. The GPS module 6 (FIG. 1) of the apparatus 2 is further structured to wirelessly communicate the determined location to the display 22 when powered by the example power conditioning section 10 (FIG. 1) of the apparatus 2. However, the GPS module 6 (FIG. 1) does not wirelessly communicate with the display 22 when current is not conducted by the power conditioning section 10 (FIG. 1).

Example 6

The display 22 can be a geographic information system (GIS) display.

The disclosed apparatus 2 preferably wirelessly communicates using a suitable Internet software interface for mapping and location, non-limiting examples of which are discussed below.

Example 7

The display 22 can be a GPS overlay of a power distribution system map 23. If the example power conditioning section 10 (FIG. 1) senses current, then the example GPS module 6 (FIG. 1) is powered and a corresponding indication (e.g., a corresponding illuminated dot 21) of the GPS overlay of the distribution system map 23 is displayed as shown in FIG. 3. If the example power conditioning section 10 (FIG. 1) ceases to sense current, then the example GPS module 6 (FIG. 1) powers down. As a result, for example, the corresponding indication (e.g., the example corresponding illuminated dot 21) of the display 22 is removed. This permits an operator of the power distribution system to identify a specific power cable, such as the example power conductor 4, and its location that has lost power for any reason.

Example 8

The display 22 can be a Google® Map UI (user interface).

Example 9

The display 22 can comprise a Google® Map API (application programming interface) 25.

Example 10

Figure 4:
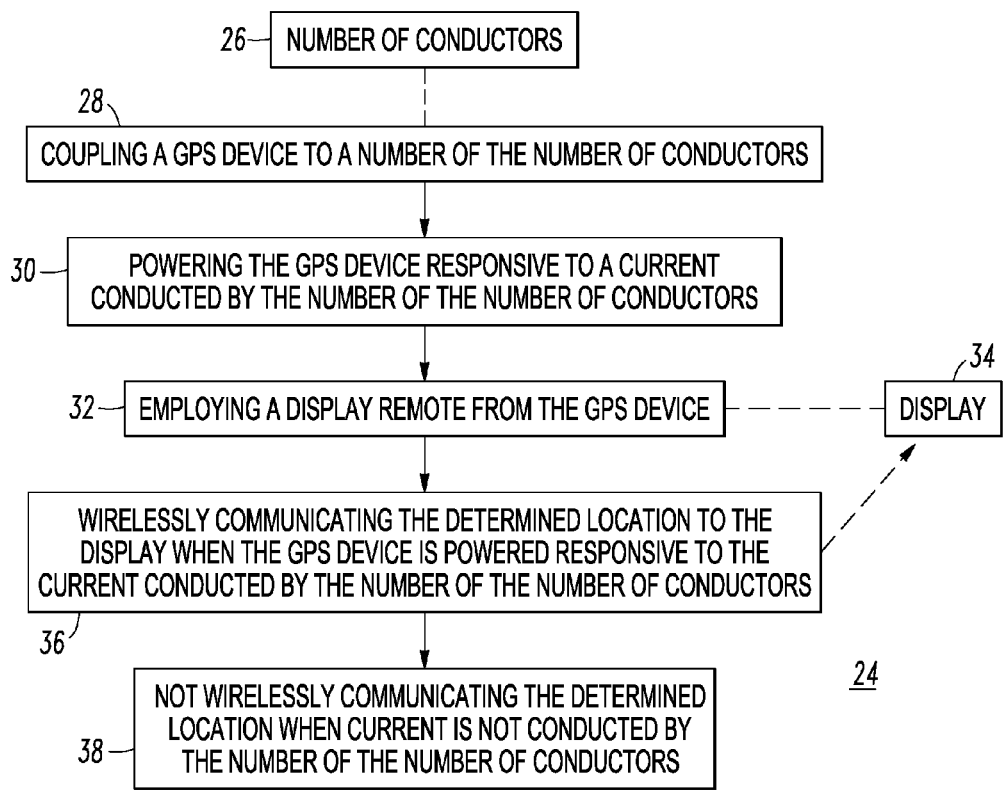
FIG. 4 is a flowchart of a method of displaying whether a number of conductors conduct current in accordance with another embodiment of the disclosed concept.

As shown in FIG. 4, a method 24 displays whether a number of conductors 26 conduct current. The method 24 includes coupling, at 28, a GPS device, such as the example apparatus 2 or GPS module 6 (FIG. 1), to a number of the number of conductors 26; and powering, at 30, the GPS module 6 responsive to a current conducted by the number of the number of conductors 26. At 32, a display 34 is employed remote from the GPS module 6. At 36, the determined location is wirelessly communicated to the display 34 when the GPS module 6 is powered responsive to the current conducted by the number of the number of conductors 26. The determined location is not wirelessly communicated, at 38, when current is not conducted by the number of the number of conductors 26.

For example and without limitation, the number of conductors 26 can be a single conductor or a multi-conductor power cable.

For example and without limitation, current is not conducted if the number of the number of conductors 26 is a broken power line, or if a circuit breaker (not shown) or network protector (not shown) for such power line is tripped or otherwise opened.

Example 11

It will be appreciated that the method 24 of FIG. 4 can further include employing as the number of conductors 26 a plurality of conductors 26, with each of the plurality of conductors 26 being capable of conducting a corresponding current. For each of the of conductors 26 other than the number of the number of conductors 26 of Example 10, a corresponding GPS module (e.g., GPS module 6) (FIG. 1) is coupled to a corresponding one of the conductors 26 other than the number of the number of conductors 26 of Example 10. The corresponding GPS module is structured to determine a corresponding location of the corresponding GPS module. The corresponding GPS module is powered responsive to a corresponding current conducted by the corresponding one of the conductors 26 other than the number of the number of conductors 26 of Example 10, the determined corresponding location is wirelessly communicated to the display 34 when the corresponding GPS module is powered responsive to the corresponding current conducted by the corresponding one of the conductors 26 other than the number of the number of conductors 26 of Example 10, and the determined corresponding location is not wirelessly communicated when the corresponding current is not conducted by the corresponding one of the conductors 26 other than the number of the number of conductors 26 of Example 10.

Example 12

The method 24 (FIG. 4) can further include for the number of the number of conductors 26 of Example 10, displaying the determined location at the display 34 when the GPS module 6 (FIG. 1) is powered responsive to the current conducted by the number of the number of conductors 26 of Example 10, and for each of the plurality of conductors 26 other than the number of the number of conductors 26 of Example 10, displaying the corresponding determined location at the display 34 when the corresponding GPS module 6 device is powered responsive to the corresponding current conducted by the corresponding one of the conductors 26 other than the number of the number of conductors 26 of Example 10.

It will be appreciated that the disclosed method 24 is advantageously employed for a power distribution system including a plurality of geographically distributed conductors 26.

Example 13

The disclosed apparatus 2 of FIG. 1 can be applied to an existing conductor, such as the example power conductor 4 of a power line infrastructure, via a hot stick 40 (shown in phantom line drawing). The example apparatus 2 includes the GPS module 6, which can be coupled (e.g., without limitation, by using the hot stick 40) to any conductor, such as the example power conductor 4. The GPS module 6 is stationary and interfaces with a remote, suitable display, such as for example and without limitation, one or both of the displays 22 (FIG. 3) and 34 (FIG. 4).

Example 14

The disclosed apparatus 2 can be applied, without contact, to an energized conductor, such as the example power conductor 4 of FIG. 1 or other power line, via a suitable clamping arrangement. For example, the coupling device 8 of the apparatus 2 is preferably structured to couple an insulated housing (not shown) of the example power conditioning section 10 to a current carrying conductor, such as a power bus or power bus bar. See, for example, incorporated-by-reference U.S. Pat. Nos. 7,145,322; and 7,253,602.

Example 15

The GPS module 6 can be used in conjunction with a suitable wireless current sensor. Non-limiting examples of wireless current sensors are disclosed in incorporated-by-reference U.S. Pat. Nos. 7,145,322; and 7,253,602. As a non-limiting example, at a predetermined range of bus current levels, the example power conditioning section 10 regulates a number of direct current (DC) voltages and provides a corresponding direct current at those bus currents to the GPS module 6, although relatively lower or relatively higher bus currents can be employed. Preferably, suitable power management routines are employed to help save energy consumption by putting a processor (not shown) into a sleep (e.g., low-power) mode and waking up when data is to be sent. As a result, this may allow the apparatus 2 to self-power at relatively lower bus currents. The processor is structured to perform a power on initialization, execute code in response to a predetermined value of the DC voltage, and enable the GPS module 6. Conversely, the processor can be structured to perform a power failure routine, execute code in response to a predetermined value of the DC voltage, and disable the GPS module 6. This advantageously prevents mis-operation of the example GPS module 6 when the example power conditioning section 10 cannot provide a suitable DC voltage to the example GPS module 6 and/or when no or insufficient current is conducted by the example power conductor 4 of FIG. 1.

Example 16

The example power conditioning sections 10,10' of FIGS. 1 and 2 can optionally detect if the current in the conductor 4 exceeds a suitable trip threshold (e.g., without limitation, a value above rated current; any suitable value) and responsively send an alarm message and/or disable the GPS device 6. In this example, the sections 10,10' can then be reset by an RF message from a handheld unit (not shown) or by detecting a magnet (not shown) of the hot stick 40.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. An apparatus for a conductor capable of conducting a current, said apparatus comprising:
   a global positioning system device structured to determine location of said global positioning system device;
   a coupling device structured to couple said global positioning system device to said conductor; and
   a power supply structured to power said global positioning system device responsive to a current conducted by said conductor,
   wherein said global positioning system device is further structured to wirelessly communicate said determined location when powered by said power supply responsive to said current conducted by said conductor,
   wherein said global positioning system device does not wirelessly communicate when current is not conducted by said conductor, and
   wherein said power supply comprises a solar power supply structured to output power responsive to solar energy, a detector structured to detect said current conducted by said conductor, and a switch structured to power said global positioning system device from said output power when said detector detects said current conducted by said conductor and to remove power from said global positioning system device when said detector does not detect current conducted by said conductor.

2. The apparatus of claim 1 wherein said conductor is a utility power cable.

3. The apparatus of claim 1 wherein said conductor is a power distribution cable.

4. The apparatus of claim 1 wherein said current conducted by said conductor is a direct current.

5. The apparatus of claim 1 wherein said current conducted by said conductor is an alternating current.

6. A system comprising:
   a conductor capable of conducting a current;
   an apparatus comprising:
      a global positioning system device structured to determine location of said global positioning system device,
      a coupling device coupling said global positioning system device to said conductor, and
      a power supply structured to power said global positioning system device responsive to a current conducted by said conductor; and
   a display remote from said apparatus,
   wherein said global positioning system device is further structured to wirelessly communicate said determined location to said display when powered by said power supply,
   wherein said global positioning system device does not wirelessly communicate when current is not conducted by said conductor, and
   wherein said power supply comprises a solar power supply structured to output power responsive to solar energy, a detector structured to detect said current conducted by said conductor, and a switch structured to power said global positioning system device from said output power when said detector detects said current conducted by said conductor and to remove power from said global positioning system device when said detector does not detect current conducted by said conductor.

7. The system of claim 6 wherein said display is a geographic information system display.

8. The system of claim 6 wherein said display is a global positioning system overlay of a power distribution system map.

9. The system of claim 6 wherein said conductor is a utility power cable.

10. The system of claim 6 wherein said conductor is a power distribution cable.

11. The system of claim 6 wherein said current conducted by said conductor is a direct current.

12. The system of claim 6 wherein said current conducted by said conductor is an alternating current.

13. The system of claim 6 wherein said power supply is further structured to determine if said current exceeds a predetermined value, and wherein said global positioning system device does not wirelessly communicate when said current exceeds said predetermined value.

14. A method of displaying whether a number of conductors conduct current, said method comprising:
   coupling a global positioning system device to a number of said number of conductors, said global positioning system device being structured to determine location of said global positioning system device;
   powering said global positioning system device responsive to a current conducted by said number of said number of conductors;
   employing a display remote from said global positioning system device;
   wirelessly communicating said determined location to said display when said global positioning system device is powered responsive to said current conducted by said number of said number of conductors;
   not wirelessly communicating when current is not conducted by said number of said number of conductors;
   detecting if the current conducted by said number of said number of conductors exceeds a trip threshold and responsively sending an alarm message or disabling the global positioning system device; and
   resetting said alarm message or resetting the global positioning system device, respectively, by detecting a hot stick employable to couple the global positioning system device to said number of said number of conductors.

15. The method of claim 14 further comprising:
   employing as said number of conductors a plurality of conductors, each of said plurality of conductors being capable of conducting a corresponding current; and
   for each of said plurality of conductors other than said number of said number of conductors:
      coupling a corresponding global positioning system device to a corresponding one of said plurality of conductors other than said number of said number of conductors, said corresponding global positioning system device being structured to determine a corresponding location of said corresponding global positioning system device,
      powering said corresponding global positioning system device responsive to a corresponding current conducted by said corresponding one of said plurality of conductors other than said number of said number of conductors, wirelessly communicating said determined corresponding location to said display when said corresponding global positioning system device is powered responsive to said corresponding current conducted by said corresponding one of said plurality of conductors other than said number of said number of conductors, and not wirelessly communicating when said corresponding current is not conducted by said corresponding one of said plurality of conductors other than said number of said number of conductors.

16. The method of claim 14 further comprising:

for said number of said number of conductors, displaying said determined location at said display when said global positioning system device is powered responsive to said current conducted by said number of said number of conductors; and for each of said plurality of conductors other than said number of said number of conductors, displaying said corresponding determined location at said display when said corresponding global positioning system device is powered responsive to said corresponding current conducted by said corresponding one of said plurality of conductors other than said number of said number of conductors.

* * * * *